(12) United States Patent
Bazarjani

(10) Patent No.: US 6,608,575 B2
(45) Date of Patent: Aug. 19, 2003

(54) HYBRID MULTI-STAGE CIRCUIT

(75) Inventor: Seyfollah Bazarjani, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/773,403

(22) Filed: Jan. 31, 2001

(65) Prior Publication Data

US 2002/0140589 A1 Oct. 3, 2002

(51) Int. Cl.[7] .............................. H03M 3/00; H03M 1/12
(52) U.S. Cl. ........................................ 341/143; 341/155
(58) Field of Search .......................... 341/69, 143, 155, 341/161

(56) References Cited

U.S. PATENT DOCUMENTS

| | | | | |
|---|---|---|---|---|
| 4,633,223 A | * | 12/1986 | Senderowicz | 341/172 |
| 5,648,779 A | * | 7/1997 | Cabler | 341/143 |
| 5,682,161 A | * | 10/1997 | Ribner et al. | 341/143 |
| 5,841,822 A | * | 11/1998 | Mittel et al. | 341/172 |
| 5,982,315 A | * | 11/1999 | Bazarjani et al. | 341/143 |
| 6,140,950 A | * | 10/2000 | Oprescu | 341/143 |
| 6,255,974 B1 | * | 7/2001 | Morizio et al. | 341/143 |

* cited by examiner

*Primary Examiner*—Jean Bruner Jeanglaude
(74) *Attorney, Agent, or Firm*—Philip R. Wadsworth; Charles D. Brown; George C. Pappas

(57) ABSTRACT

A multi-stage circuit that includes a number of stages, with at least one stage being of a first type and at least one stage being of a second type. Each stage receives either a circuit input signal or an output signal from a preceding stage, processes (e.g., filters) the received signal, and provides a respective output signal. Each first type (or second type) stage operates based on one or more clock signals having a frequency of $f_S$ (or $f_S/N$), where $f_S$ is the sampling frequency and N is an integer greater than one. Each first type stage may be implemented with a correlated double-sampling circuit, an auto-zeroing circuit, or a chopper stabilization circuit. Each second type stage may be implemented with a multi-sampling (i.e., double-sampling or higher order sampling) circuit. The multi-stage circuit may be designed to implement a lowpass filter, a $\Delta\Sigma$ ADC, or some other circuit.

20 Claims, 13 Drawing Sheets

HYBRID MULTI-STAGE CIRCUIT

BACKGROUND OF THE INVENTION

I. Field of the Invention

The present invention relates to circuits. More particularly, the present invention relates to a hybrid multi-sampling circuit utilizing different types of sampling circuit.

II. Description of the Related Art

Many communication and data transmission systems employ active filters, analog-to-digital converters (ADCs), and other active circuits to perform some of the required signal processing. These active circuits may utilize operational amplifiers (op-amps) as one of the basic building elements. The amplifiers can be designed to provide high input impedance and large signal gain.

When implemented in an integrated circuit, an amplifier inherently exhibits some amount of DC offset and low frequency (1/f) noise at its input. These effects are worse when a low-voltage CMOS process is used to fabricate the amplifier. Also, the achievable amplifier gain is typically low in such process technology, relative to other linear-IC processes such as bipolar.

The input DC offset, low frequency noise, and low gain of an amplifier can contribute to degrade the performance of an active circuit that employ such amplifier. For a filter or ADC, such performance degradation may correspond to a reduced dynamic range, which may translate into worse overall performance for the system that employs the filter or ADC.

Many active filters and ADCs fabricated within CMOS integrated circuits are designed and implemented using switched capacitor circuits. Switched capacitor circuits employ amplifiers, capacitors, and switches, all of which can be (relatively) easily fabricated in a CMOS process. It is well known that the power consumption of a CMOS circuit is related to its switching frequency (i.e., power consumption is proportional to $f_S$). For many applications, such as cellular telephone, it is highly desirable to provide high performance at reduced power consumption. For lower power consumption, double-sampling and higher order sampling switched capacitor circuits can be designed and implemented. These "multi-sampling" switched capacitor circuits sample the signals at multiple (i.e., N) phases of a lower frequency clock (i.e., $f_S/N$).

Multi-sampling switched capacitor circuits, while having lower power consumption and other advantages, are vulnerable to input DC offset and low frequency noise. Moreover, multi-sampling circuits are typically implemented with n signal paths, and these n-path circuits are sensitive to path mismatch which causes image error.

Thus, a circuit design that can provide some of the benefits of multi-sampling switched capacitor circuits while ameliorating the deleterious effects of input DC offset, low frequency noise, and path mismatch is highly desirable.

SUMMARY OF THE INVENTION

Certain aspects of the present invention provide a multi-stage circuit that utilizes different types of sampling circuit to combat the deleterious effects of input DC offset, low frequency noise, finite amplifier gain, and path mismatch while providing high performance and reduced power consumption. The multi-stage circuit includes a number of stages, with at least one stage being of a first type and at least one stage being of a second type.

Each stage of the first type receives either an input signal for the multi-stage circuit or an output signal from a preceding stage, processes (e.g., filters) the received signal, and provides a respective output signal. Each stage of the first type operates based on one or more clock signals having a frequency of $f_S$ (i.e., the sampling frequency). Each stage of the second type receives an output signal from a preceding stage, processes the received signal, and provides a respective output signal. Each stage of the second type operates based on a respective set of one or more clock signals having a divided frequency of $f_S/N_X$, where $N_X$ is a frequency scaling factor for that second type stage and is an integer greater than one.

Each stage of the first type may be implemented with a single-sampled circuit such as, for example, a correlated double-sampling (CDS) circuit, an auto-zeroing (AZ) circuit, a chopper stabilization (CS) circuit, or some other circuit capable of providing similar desired characteristics. Each stage of the second type may be implemented with a "multi-sampling" circuit, i.e., a double-sampling or higher order sampling circuit.

The multi-stage circuit may be designed to implement a (lowpass or bandpass) filter, a delta-sigma analog-to-digital converter ($\Delta\Sigma$ ADC), or some other circuit. Various responses and orders for the multi-stage circuit (e.g., filter or ADC) may be achieved by cascading the proper number of stages and selecting the proper transfer function for each stage.

The stages of the multi-stage circuit may be designed using sampled-data domain circuit techniques such as switched capacitor and switched current, or possibly continuous-time circuit techniques such as active-RC, gm-C, and MOSFET-C, or some other circuit technique. The multi-stage circuit may also be implemented in CMOS or some other IC process.

Various aspects, embodiments, and features of the invention are described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION OF THE SPECIFIC EMBODIMENTS

Figure 1:
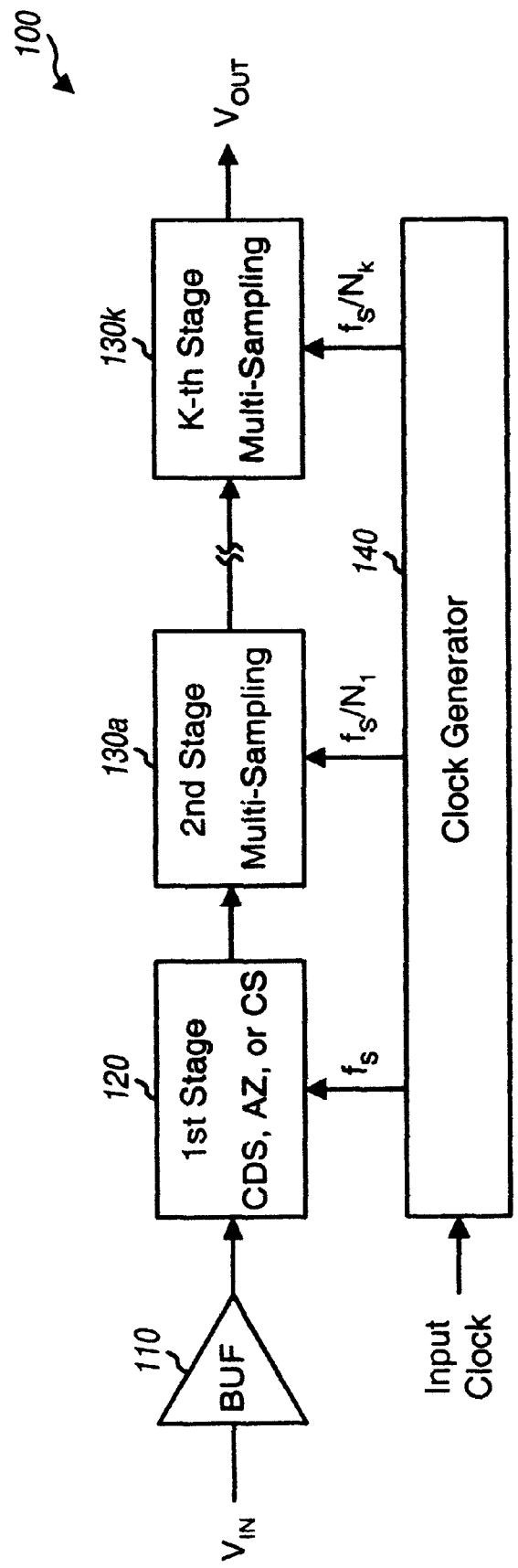
FIG. 1 is a block diagram of a hybrid multi-stage circuit utilizing different types of sampling circuit, in accordance with an aspect of the invention.

FIG. 1 is a block diagram of a "hybrid" multi-stage circuit 100 utilizing different types of sampling circuit, in accordance with an aspect of the invention. Multi-stage circuit 100 includes an input buffer 110 coupled in series with a number of sampling circuit stages. Buffer 110 provides buffering and may further be designed to provide lowpass filtering of an input signal, $V_{IN}$. The buffered signal is then provided to a first stage 120 that processes (e.g., filters) the signal based on a particular transfer function. In an embodiment, first stage 120 is implemented as a single-sampling circuit such as, for example, a correlated double-sampling (CDS) circuit, an auto-zeroing (AZ) circuit, a chopper stabilization (CS) circuit, or some other type of circuit capable of providing similar desired characteristics, which are described in further detail below. By implementing the first stage with a single-sampling circuit, deleterious effects due to input DC offset, low frequency noise, and finite amplifier gain are ameliorated and path mismatch of subsequent stages are not as critical.

The output signal from first stage 120 is provided to one or more stages 130a through 130k, which further process the signal. In the embodiment shown in FIG. 1, stages 130a through 130k couple in series, and each subsequent stage 130 processes the output signal from a preceding stage. Each stage 130 can be implemented as a "multi-sampling" circuit, which may be a double-sampling circuit or a higher order (e.g., quadruple) sampling circuit. The last stage 130k provides the output signal, $V_{OUT}$. Moreover, each of stages 130 may have a different sampling frequency of $f_S/N_X$, where $N_X$ is a frequency scaling factor for that particular stage 130 and is an integer greater than one.

A clock generator 140 receives an input clock and provides one or more clock signals to each of the stages in multi-stage circuit 100. These clock signals are used to sample the signal based on, for example, a switched capacitor circuit design. For a double-sampling circuit, clock generator 140 provides two clock signals at half the sampling frequency, $f_S/2$, and out of phase by 180 degrees. In practical implementation, "bottom plate" sampling is used to prevent signal dependent charge injection, as described below.

By utilizing different types of sampling circuit, multi-stage circuit 100 can provide numerous benefits. Stage 120 may be designed to provide low frequency (1/f) noise and DC offset cancellation, which can provide improved performance (e.g., higher dynamic range). Stage 120 may further be designed such that a low DC gain amplifier may be used for the stage, which is especially advantageous for CMOS circuits having lower gain than some other types of circuits (e.g., bipolar). Stages 130 may be designed using multi-sampling circuits that consume less power because of the lower sampling frequency (i.e., $f_S/N$, where N is an integer greater than one).

The multi-stage circuit topology shown in FIG. 1 may be used to implement various types of circuit such as a delta-sigma analog-to-digital converter (ΔΣ ADC), a filter, and others. The overall circuit (e.g., filter or ADC) may be a lowpass or bandpass circuit even though the first stage is typically implemented as a lowpass circuit. The implementation of a ΔΣ ADC and a lowpass filter utilizing different types of sampling circuit are described below.

Figure 2A:
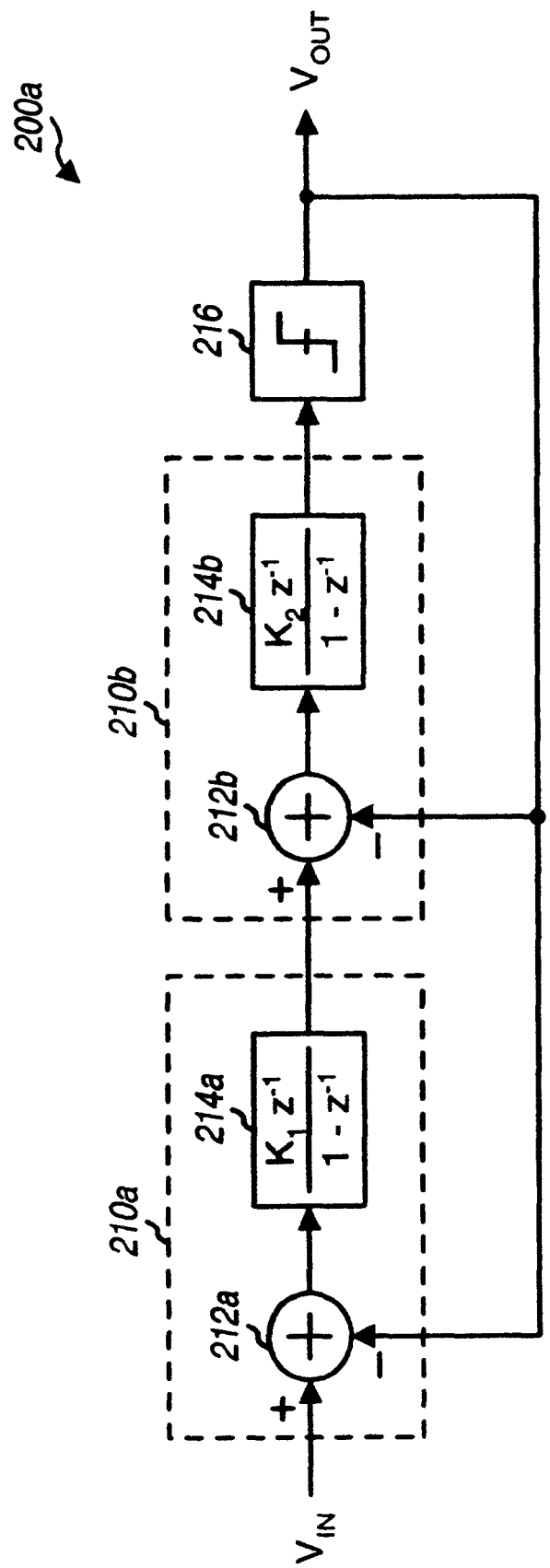
FIG. 2A is a diagram of a second-order delta-sigma ($\Delta\Sigma$) modulator.

FIG. 2A is a diagram of a second-order ΔΣ modulator 200a, which is a building block that may be used to implement ΔΣ ADCs of various types and orders. ΔΣ modulator 200a includes two sections 210a and 210b coupled in series and operated at a sampling frequency of $f_S$. Each section 210 includes a summer 212 coupled to a filter 214. For section 210a, summer 212a subtracts the quantized output, $V_{OUT}$, from the input signal, $V_{IN}$. And for section 210b, summer 212b subtracts the quantized output, $V_{OUT}$, from the output signal from the preceding section 210a. Each filter 214 provides a particular transfer function, $H_S(z)$, which for a second order ΔΣ modulator is typically a first order integrator expressed as:

$$H_s(z) = \frac{K \cdot z^{-1}}{1 - z^{-1}}, \quad \text{Eq (1)}$$

where K is the gain for the section. The transfer function, $H_S(z)$, has a pole at +1 and a zero at 0 on the z-plane. The output signal from section 210b is provided to a quantizer 216, which quantizes the signal and provides the quantized output, $V_{OUT}$. For a ΔΣ modulator, quantizer 216 is a 1-bit quantizer.

Figure 2B:
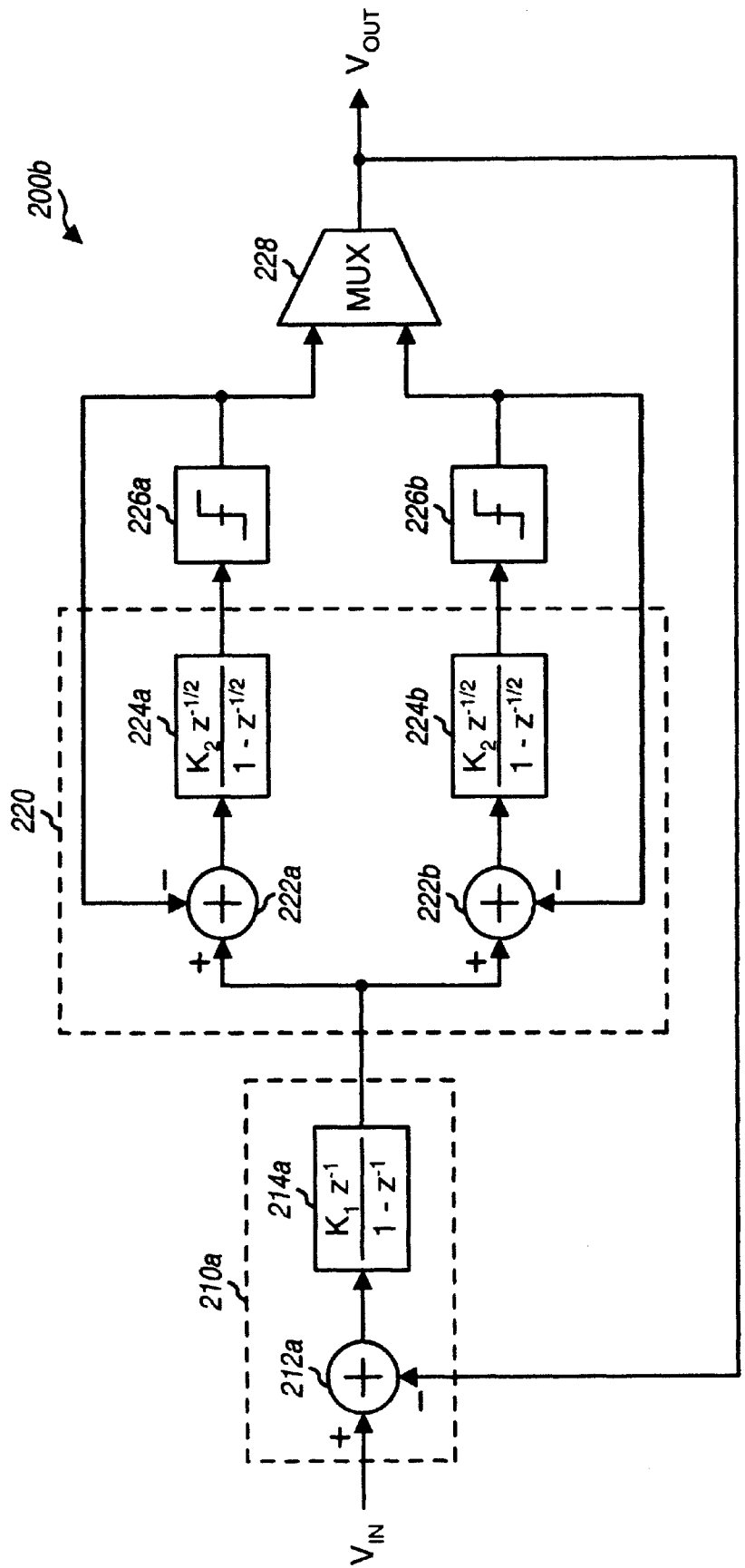
FIG. 2B is a diagram of a second-order $\Delta\Sigma$ modulator in accordance with an embodiment of the invention.

FIG. 2B is a diagram of a second-order ΔΣ modulator 200b in accordance with an embodiment of the invention. ΔΣ modulator 200b is functionally equivalent to ΔΣ modulator 200a in FIG. 2A, but includes a first section 210a operated at the sampling frequency of $f_S$ and a second section 220 operated at half of the sampling frequency, or $f_S/2$. Section 220 replaces section 210b in FIG. 2A and includes two signal paths. Each signal path operates at the sampling frequency of $f_S/2$ but on a phase that is opposite from that of the other signal path. Each signal path includes a summer 222 coupled in series with a filter 224. Summer 222 subtracts the quantized output for that signal path from the output signal from section 210a. Filter 224 has a transfer function that is similar to that of filter 214b in section 210b, but modified to reflect the sampling frequency of $f_S/2$ (i.e., the $z^{-1}$ terms in $H_S(z)$ are replaced with $Z^{-1/2}$ terms).

The output signal from each filter 224 is provided to a respective quantizer 226, which quantizes the signal with the same clock phase associated with the filter and provides the quantized output for that signal path. Thus, quantizers 226a and 226b quantize their respective input signals based on two phases of the sampling clock. A multiplexer 228 receives and multiplexes the quantized outputs for the two clock phases and provides a quantized output at the sampling frequency of $f_S$ for section 210a.

Figure 3A:
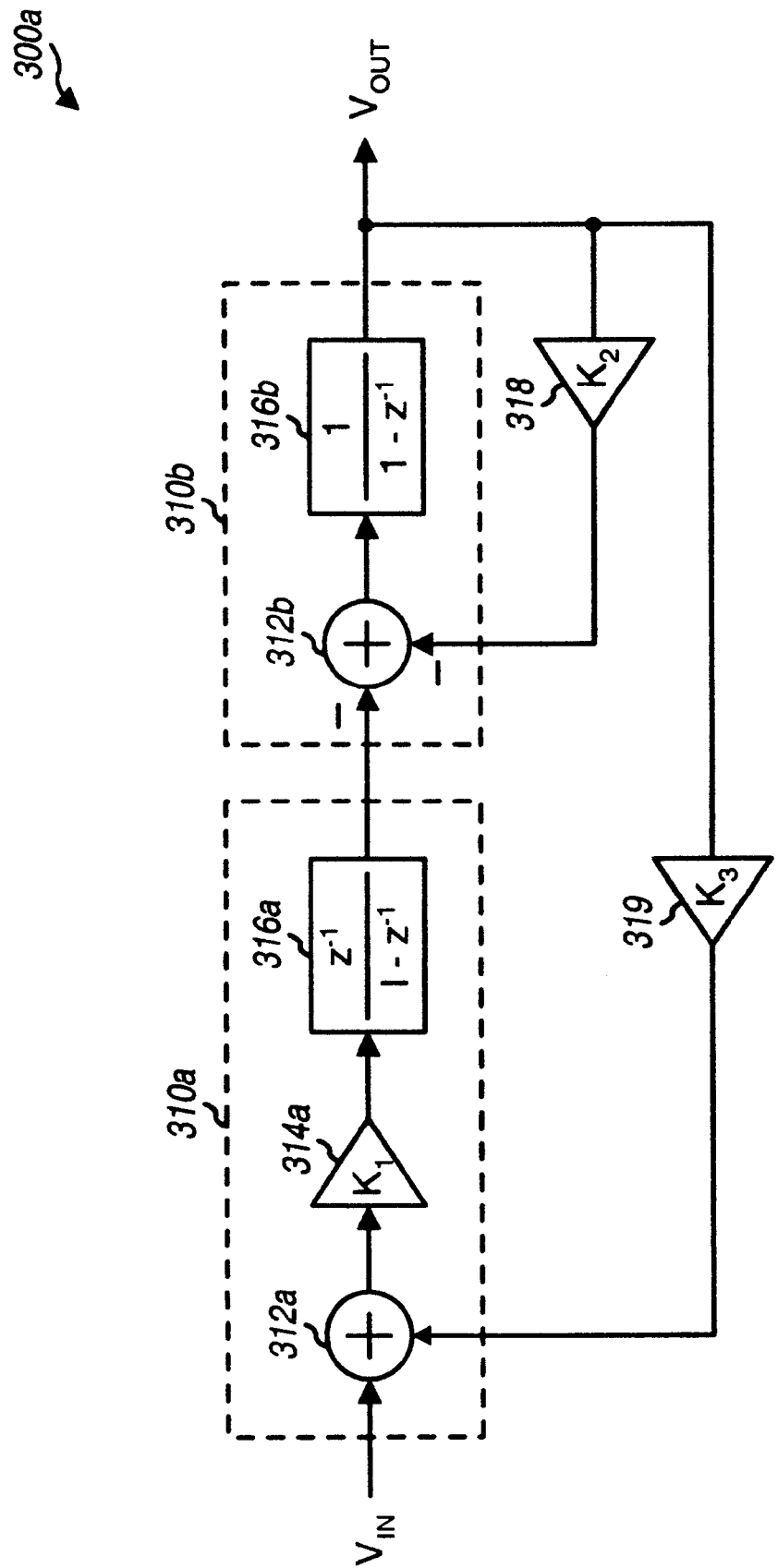
FIG. 3A is a diagram of a biquadratic (or biquad) lowpass filter.

FIG. 3A is a diagram of a biquadratic (or biquad) lowpass filter 300a, which is a building block that may be used to implement a second order or higher order lowpass filter. Biquad lowpass filter 300a includes two sections 310a and 310b coupled in series and operated at the sampling frequency of $f_S$. Section 310a includes a summer 312a, a gain element 314a, and a filter 316a coupled in series. Summer 312a sums the input signal, $V_{IN}$, with the output signal from a gain element 319. Gain element 314a scales the summed signal with a gain of $K_1$. Filter 316a then filters the scaled signal with a transfer function of $$\frac{z^{-1}}{1-z^{-1}},$$

which is an integrator having a pole at +1 and a zero at 0 on the z-plane.

Section 310b includes a summer 312b and a filter 316b coupled in series. Summer 312b sums the inverted output signal from section 310a with the inverted output signal from a gain element 318. Filter 316b then filters the scaled signal with a transfer function of $$\frac{1}{1-z^{-1}},$$

which is an integrator having a pole at +1 on the z-plane. Section 310b provides the output signal, $V_{OUT}$, which is also provided to gain elements 318 and 319. Gain elements 318 and 319 receive and scale the output signal, $V_{OUT}$, with gains of $K_2$ and $K_3$, respectively. Different overall response for lowpass filter 300a may be achieved by selecting the proper gains for $K_1$, $K_2$, and $K_3$.

Biquad lowpass filter 300a is similar in topology to ΔΣ modulator 200a in FIG. 2A. However, lowpass filter 300a feeds back continuous (i.e., analog) signals to sections 310a and 310b, whereas ΔΣ modulator 200a feeds back a quantized signal to sections 210a and 210b.

Figure 3B:
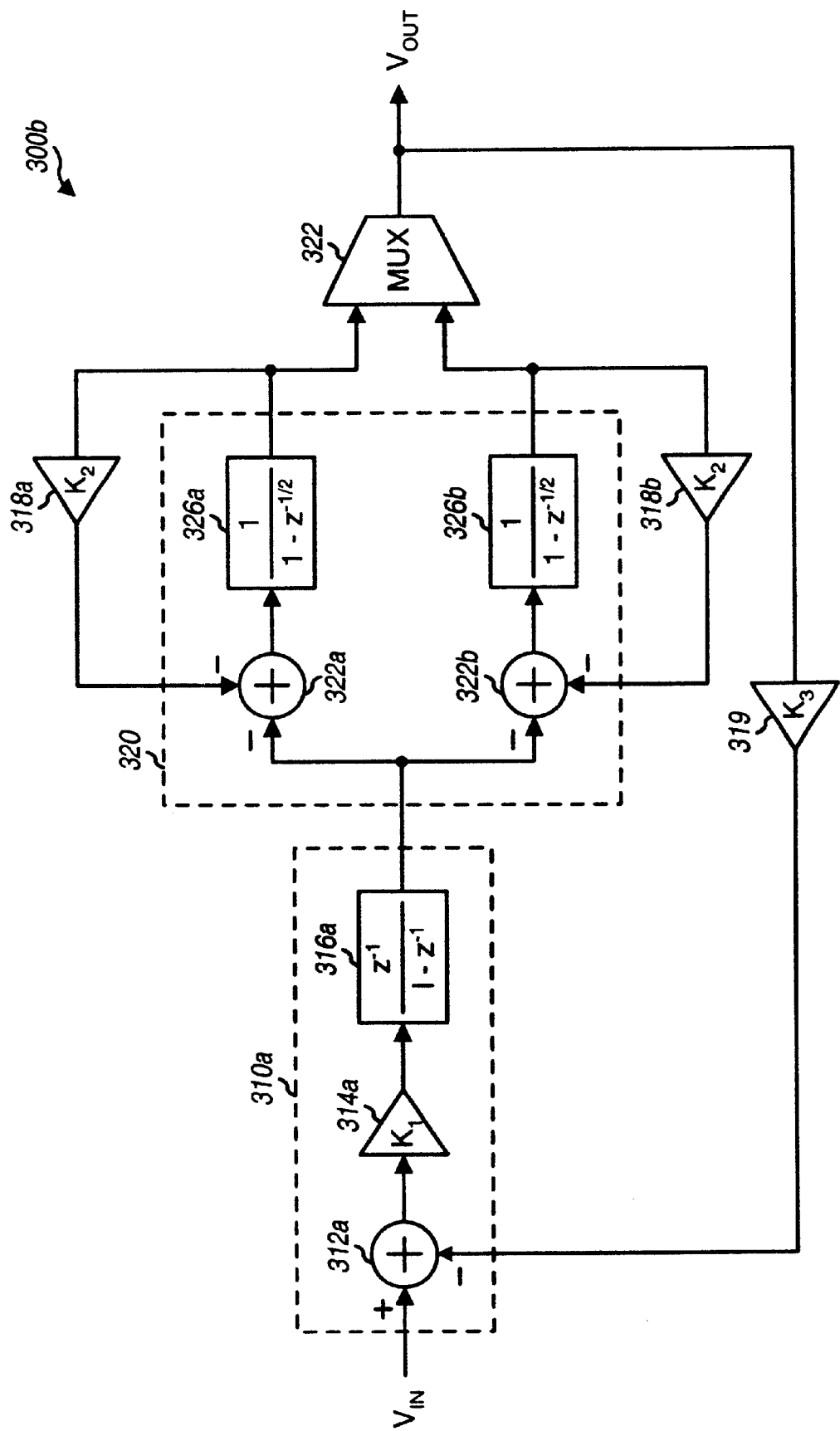
FIG. 3B is a diagram of a biquad lowpass filter in accordance with an embodiment of the invention.

FIG. 3B is a diagram of a biquad lowpass filter 300b, in accordance with an embodiment of the invention. Biquad lowpass filter 300b is functionally equivalent to biquad lowpass filter 300a in FIG. 3A, but includes a first section 310a operated at the sampling frequency of $f_S$ and a second section 320 operated at half the sampling frequency, or $f_S/2$. Section 320 replaces section 310b and includes two signal paths. Each signal path operates at the sampling frequency of $f_S/2$, but on a phase that is opposite from that of the other signal path.

Each signal path includes a summer 322 coupled in series with a filter 326. Summer 322 sums the inverted output signal from section 310a with the inverted output signal from a respective gain element 318. Filter 326 has a transfer function that is similar to that of filter 316b in section 310b but modified to reflect the sampling frequency of $f_S/2$ (i.e., the $z^{-1}$ terms in the transfer function are replaced with $z^{-1/2}$ terms). The output signal from each signal path is provided to a respective gain element 318 and to a multiplexer 322. Multiplexer 322 time-division multiplexes the analog output signals from the two signal paths and provides the output signal, $V_{OUT}$, which is provided to gain element 319.

As noted above, a higher order lowpass filter may be designed by cascading multiple biquad lowpass filters. The desired overall frequency response for the filter may be obtained by selecting the proper frequency response for each biquad lowpass filter, as is known in the art. The first section of the first biquad lowpass filter may be operated at the sampling frequency of $f_S$. The second section of the first biquad lowpass filter and the sections of subsequent biquad lowpass filters may be operated at the sampling frequency of $f_S/N$, where N may be any integer greater than one.

Figure 4A:
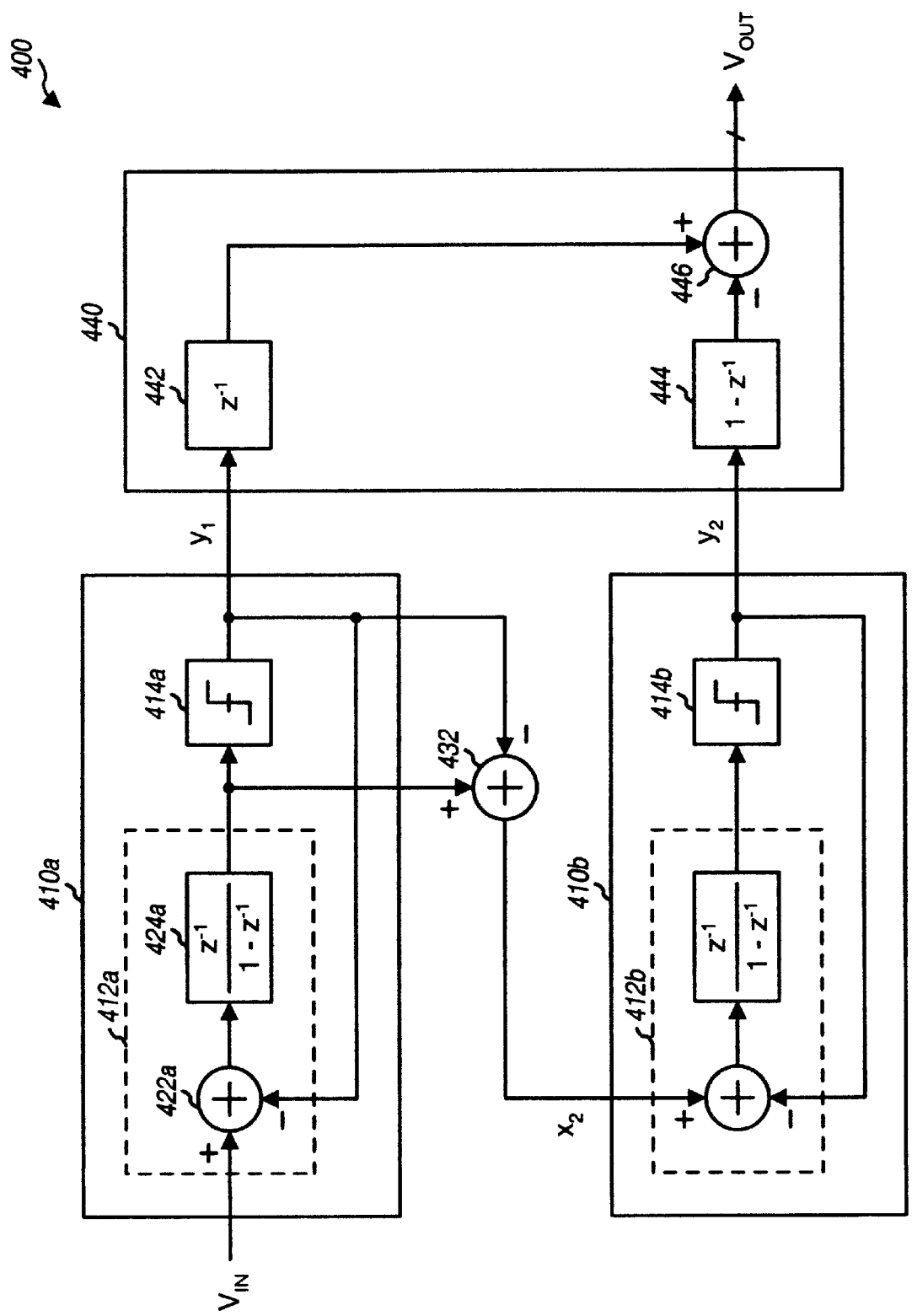
FIG. 4A is a diagram of a MASH 1–1 $\Delta\Sigma$ ADC.

FIG. 4A is a diagram of a MASH 1–1 ΔΣ ADC 400, which can be used to digitize an input signal, $V_{IN}$, and provide a multi-bit output, $V_{OUT}$. MASH ADC 400 includes two loops 410a and 410b, with each loop 410 including a section 412 coupled in series with a quantizer 414. Each section 412 includes a summer 422 coupled in series with a filter 424. Summer 422 within each section subtracts the loop quantized output, $y_n$, from the loop input signal, which is $V_{IN}$, for loop 410a and $x_2$ for loop 410b. Filter 424 filters the combined signal from summer 422 with a transfer function of $$\frac{z^{-1}}{1-z^{-1}},$$

which is an integrator having a pole at +1 and a zero at 0 on the z-plane.

For each loop, quantizer 414 receives and quantizes the filtered signal from section 412 and provides the loop quantized output, $y_n$, where n is the loop number (i.e., n=1 or 2 for MASH ADC 400). A feed-forward element 432, which is implemented with a summer, receives and subtracts the quantized output, $y_n$, from the quantizer input (which is the filtered signal from section 412a) to generate the input signal, $x_2$, for loop 410b.

The quantized outputs, $y_1$ and $y_2$, from loops 410a and 410b are further provided to a noise cancellation logic 440. Within noise cancellation logic 440, the quantized outputs, $y_1$ and $y_2$, are respectively provided to elements 442 and 444 having the transfer functions shown in FIG. 4A. The output from element 444 is then subtracted from the output from element 442 by a summer 446 to provide the MASH ADC output, $V_{OUT}$.

For MASH 1–1 ADC 400, section 412a in loop 410a can be implemented with a correlated double-sampling circuit, an auto-zeroing circuit, or a chopper stabilization circuit to provide improved performance with respect to low frequency noise (1/f), DC offset, and finite amplifier gain. Section 412b in loop 410b can be implemented with a double-sampling or higher order sampling circuit to reduce power consumption.

Figure 4B:
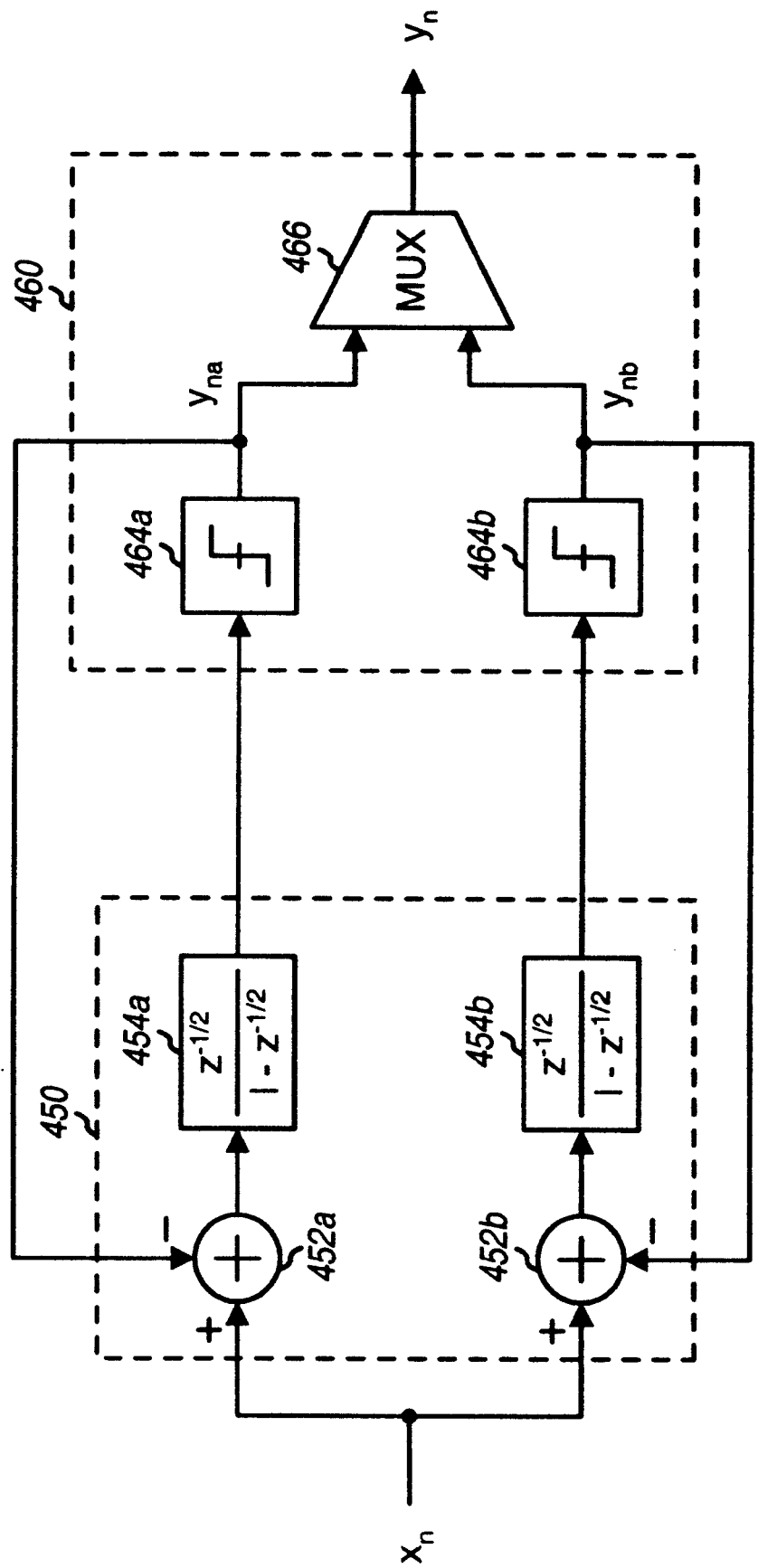
FIG. 4B is a diagram of an embodiment of a section and a quantizer of a MASH ADC, both of which are designed using double-sampling techniques.

FIG. 4B is a diagram of an embodiment of a section 450 and a quantizer 460 of a MASH ADC, both of which are implemented with double-sampling techniques. Double-sampling section 450 may be used for section 412b in MASH ADC 400, and quantizer 460 may be used for quantizer 414b.

Double-sampling section 450 includes two signal paths, with each signal path operated at the sampling frequency of $f_S/2$ but on a phase that is opposite from that of the other signal path. Each signal path includes a summer 452 coupled to a filter 454, which are similar in topology to that for a single-sampling section (e.g., section 412a in FIG. 4A). However, filter 454 has a transfer function that is modified to reflect the sampling frequency of $f_S/2$ (i.e., the $z^{-1}$ terms are replaced with $Z^{-1/2}$ terms).

Double-sampling quantizer 460 includes two quantizers 464a and 464b that respectively couple to the two signal paths of the preceding section 450. Each quantizer 464 receives and quantizes a respective filtered signal from section 450 and provides a quantized output, $y_{nb}$, which is the feedback for that clock phase. Quantizers 464a and 464b operate on opposite phases of the sampling clock, which has a frequency of $f_S/2$. A multiplexer 466 receives and multiplexes the quantized outputs, $y_{na}$ and $y_{nb}$, from quantizers 464a and 464b to provide the loop quantized output, $Y_n$.

As designated by its name, MASH 1–1 ADC 400 includes two loops, with each loop having a first order. Each first order loop is formed by a single, first order section 412 within the loop. More loops and/or higher order loops may be implemented to provide a MASH ADC having improved performance (e.g., higher dynamic range).

Figure 5:
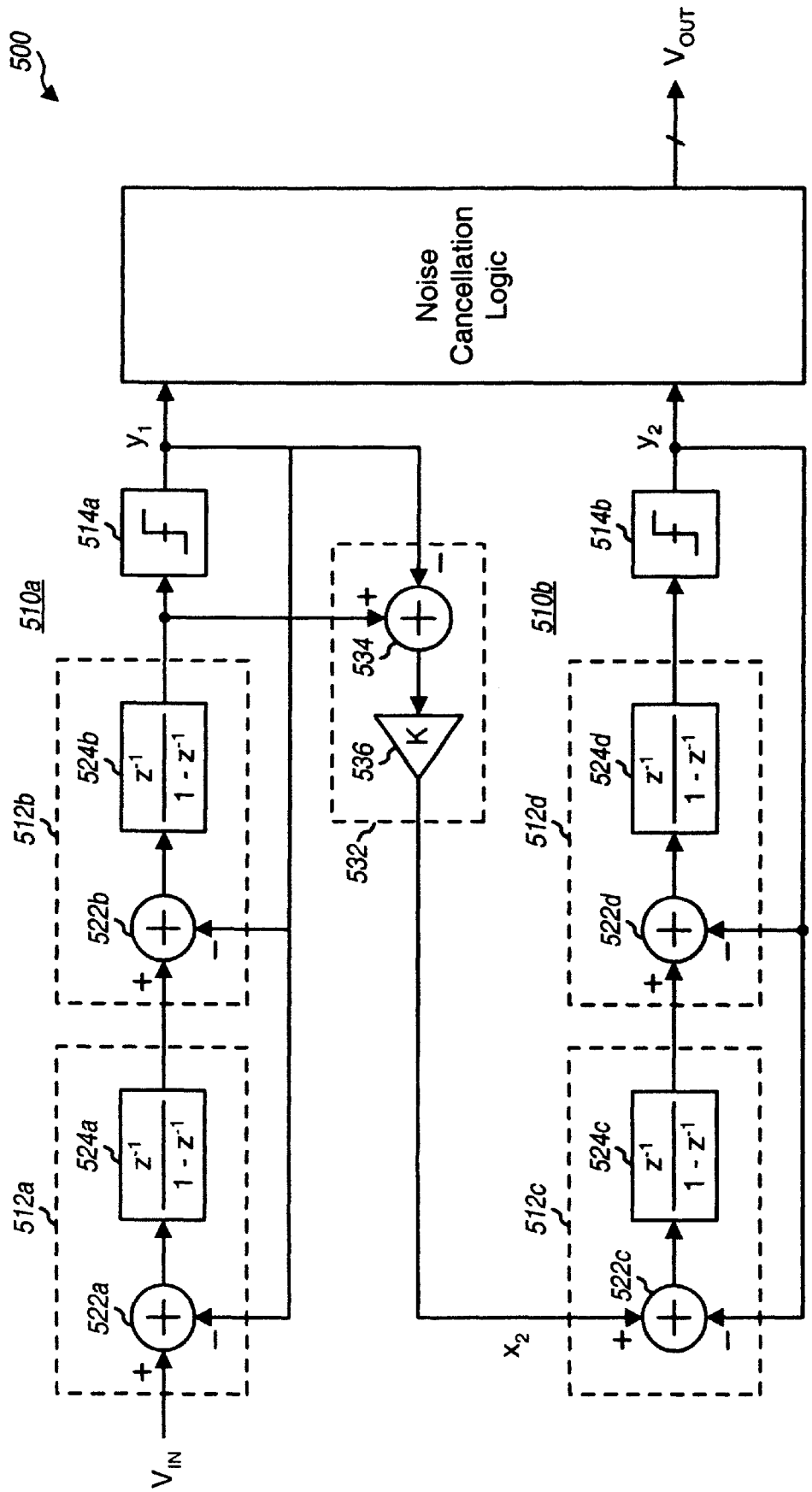
FIG. 5 is a diagram of a MASH 2–2 $\Delta\Sigma$ ADC.

FIG. 5 is a diagram of a MASH 2–2 ΔΣ ADC 500, which can also be used to digitize an input signal, $V_{IN}$, and provide a multi-bit output, $V_{OUT}$. MASH ADC 500 includes two loops 510a and 510b, with each loop 510 including two sections 512 and a quantizer 514 coupled in series. Each section 512 of each loop includes a summer 522 coupled in series with a filter 524. Summer 522 subtracts the loop quantized output, $y_n$, from the section input signal, where n is the loop number (i.e., n=1 or 2). Filter 524 then filters the combined signal from summer 522 with a transfer function of $$\frac{z^{-1}}{1-z^{-1}},$$

which is an integrator having a pole at +1 and a zero at 0 on the z-plane. For each loop, quantizer 514 receives and quantizes the filtered signal from the last (i.e., second) section in the loop and provides the loop quantized output, $Y_n$.

A feed-forward element 532 determines the quantization error from first loop 510a and generates the input signal, $x_2$, for second loop 510b. In the embodiment shown, feed-forward element 532 includes a summer 534 coupled to a gain element 536. Summer 534 receives and subtracts the loop quantized output, $y_1$, from the filtered signal from section 512b to provide a signal indicative of the quantization error. Gain element 536 scales the error signal with a scaling factor of K to generate the input signal, $x_2$, for loop 510b. A noise cancellation logic 540 receives and processes the quantized outputs, $Y_1$ and $Y_2$, from loops 510a and 510b to provide the MASH ADC output, $V_{OUT}$.

For MASH 2-2 ADC 500, section 512a in loop 510a (which is the first or input section of the MASH ADC) can be implemented with a correlated double-sampling circuit, an auto-zeroing circuit, or a chopper stabilization circuit to provide improved performance with respect to low frequency noise (1/f), DC offset, and finite amplifier gain. Section 512b in loop 510a and sections 512c and 512d in loop 510b (which are the remaining sections of the MASH ADC) can be implemented using double-sampling or higher order sampling circuits to reduce power consumption.

Sections 512b, 512c, and 512d are similar in topology to section 412b in FIG. 4A, and each of these sections may be implemented with double-sampling section 450 shown in FIG. 4B. In that case, quantizers 514a and 514b may each be implemented with double-sampling quantizer 460 shown in FIG. 4B. For each double-sampling quantizer, the output from multiplexer 466 is provided to noise cancellation logic 540. For quantizers 514a of loop 510a, the output from multiplexer 466 may also be provided as the feedback for the single-sampling section (e.g., section 512a).

Figure 6A:
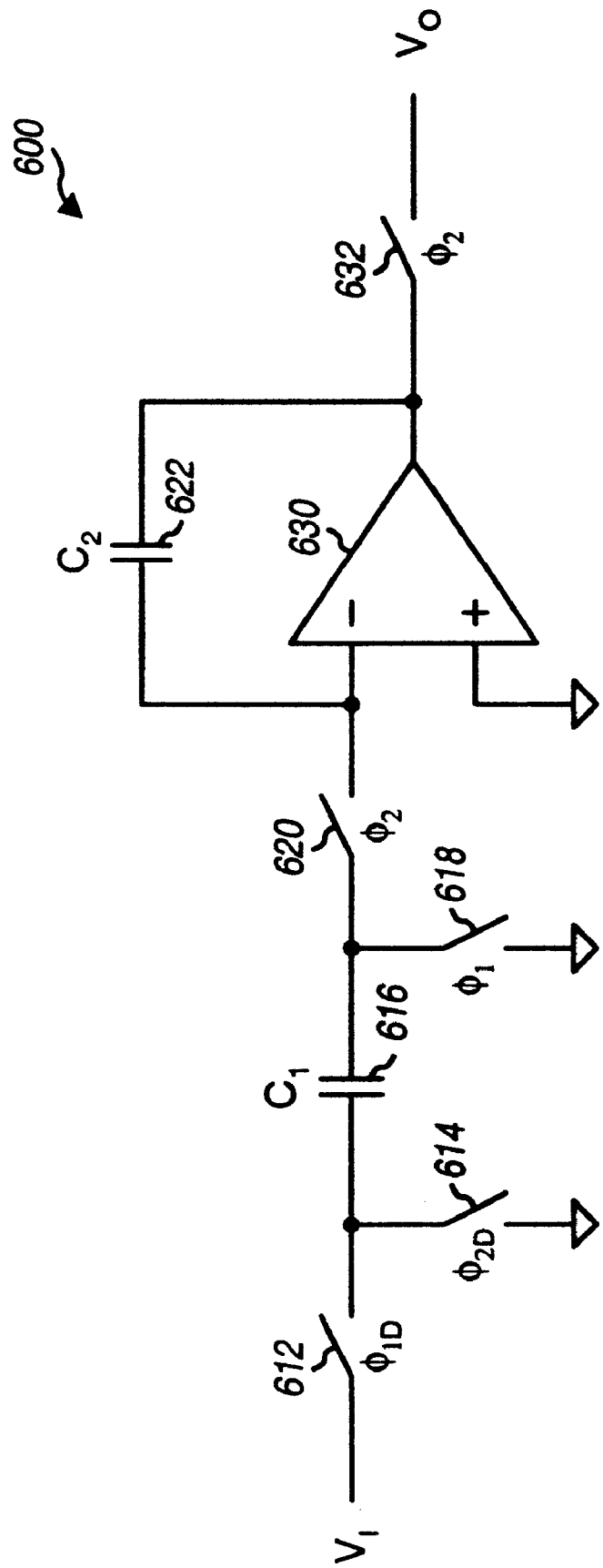
FIG. 6A is a schematic diagram of an integrator implemented with a single-sampling switched capacitor (SC) circuit.

FIG. 6A is a schematic diagram of an integrator implemented with a single-sampling switched capacitor circuit 600. Single-sampling circuit 600 includes a switch 612 having one end that couples to an input signal, $V_1$. The other end of switch 612 couples to one end of a switch 614 and one end of a capacitor 616. The other end of capacitor 616 couples to one end of switches 618 and 620. The other ends of switches 614 and 618 couple to AC ground. The other end of switch 620 couples to the inverting input of an amplifier 630 and to one end of a capacitor 622. The non-inverting input of amplifier 630 couples to AC ground. The other end of capacitor 622 couples to the output of amplifier 630 and to one end of a switch 632. The other end of switch 632 comprises the output signal, $V_O$, for single-sampling circuit 600.

Single-sampling circuit 600 operates as follows. During the first phase, $\phi_1$, switches 612 and 618 are closed, and capacitor 616 is charged. And during the second phase, $\phi_2$, switches 614, 620, and 632 are closed, and the voltage previously charged on capacitor 616 is provided to the output, $V_O$. To implement bottom plate sampling, switch 618 is opened first at the end of the first phase, and switch 612 is opened a short time later (as designated by the $\phi_{1D}$ next to switch 612 in FIG. 6A). This prevents channel charges on switch 612 (which is dependent on the input signal, $V_1$) from being injected into capacitor 616. Switch 618 only introduces a DC offset (and not a signal dependent quantity), which can be canceled out. Correspondingly, switch 620 is opened first at the end of the second phase, and switch 614 is opened a short time later (as designated by the $\phi_{2D}$ next to switch 614 in FIG. 6A).

Figure 6B:
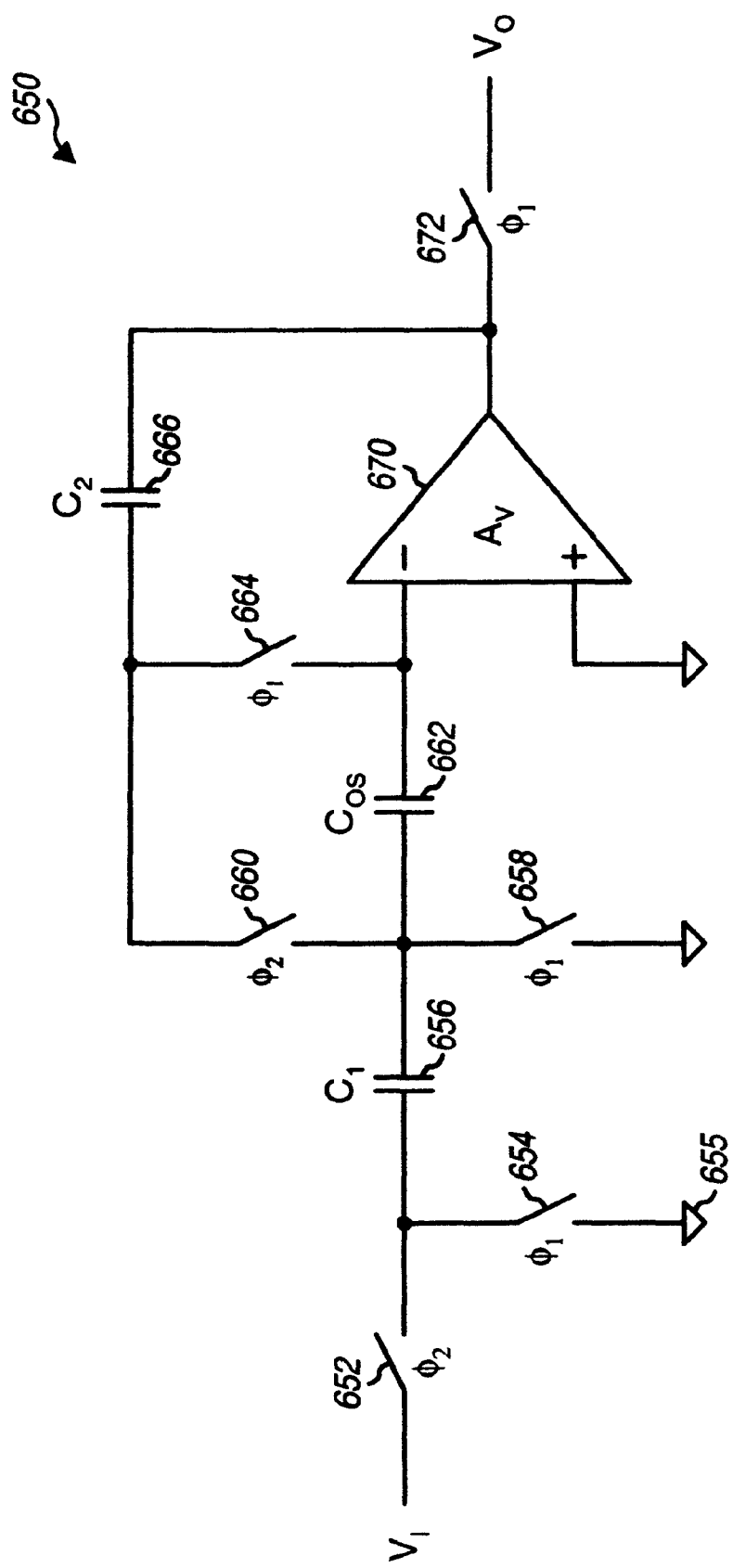
FIG. 6B is a schematic diagram of an integrator implemented with a correlated double-sampling SC circuit.

FIG. 6B is a schematic diagram of an integrator implemented with a correlated double-sampling switched capacitor circuit 650. Correlated double-sampling circuit 650 may be used for the first stage of a multi-stage circuit. For example, correlated double-sampling circuit 650 may be used for the first section 210a of $\Delta\Sigma$ modulator 200b in FIG. 2B, the first section 310a of biquad lowpass filter 300b in FIG. 3B, the first section 412a of MASH ADC 400 in FIG. 4A, and the first section 512a of MASH ADC 500 in FIG. 5.

Correlated double-sampling circuit 650 includes a switch 652 having one end that couples to an input signal, $V_I$. The other end of switch 652 couples to one end of a switch 654 and one end of a capacitor 656. The other end of capacitor 656 couples to one end of switches 658 and 660 and one end of a capacitor 662. The other ends of switches 654 and 658 couple to AC ground. The other end of capacitor 662 couples to the inverting input of an amplifier 670 and to one end of a switch 664. The non-inverting input of amplifier 670 couples to AC ground. The other ends of switches 660 and 664 couple together and to one end of a capacitor 666. The other end of capacitor 666 couples to the output of amplifier 670 and to one end of a switch 672. The other end of switch 672 comprises the output signal, $V_O$, for correlated double-sampling circuit 650.

As shown in FIG. 6, each of the switches is operated (i.e., closed) on either the first phase, $\phi_1$, or second phase, $\phi_2$, of a sampling clock. The first and second phases are 180° out of phase. A timing diagram of the clock signals used for correlated double-sampling circuit 650 is shown in FIG. 7B.

Correlated double-sampling circuit 650 provides a transfer function of $$\frac{K \cdot z^{-1}}{1-z^{-1}},$$

where $K=C_1/C_2$. This transfer function represents an integrator having a pole at +1 and a zero at 0 on the z-plane. A transfer function of $$\frac{K}{1-z^{-1}}$$

may also be obtained by operating switch 672 on the second phase, $\phi_2$, instead of the first phase.

For each of the sections shown in FIGS. 2A through 5, a summer resides at the input of the section and is used to combine the section input signal with a feedback signal. This summer can be integrated within correlated double-sampling circuit 650 by providing the feedback signal to node 655, which is shown coupled to AC ground in FIG. 6. A subtraction function can be obtained by inverting the feedback signal and providing the inverted feedback signal to node 655.

Correlated double-sampling circuit 650 operates as follows. During the first phase, $\phi_1$, switches 654, 658, 664, and 672 are closed, capacitor 656 is discharged, capacitor 662 is charged to a voltage corresponding to the DC offset between the inverting and non-inverting inputs of amplifier 670, and the voltage previously charged on capacitor 666 is provided as the output, $V_O$. The DC offset voltage, $V_{OS}$, charged on capacitor 662 is later used during the second phase to subtract out the input DC offset of amplifier 670 from the input signal, $V_I$. During the second phase, switches 652 and 660 are closed, the input signal, $V_I$, charges or discharges capacitor 666 by an amount related to the voltage applied across capacitor 656.

For correlated double-sampling circuit 650, the improvement in DC offset and low frequency (1/f) noise is achieved by sampling the offset and noise during one clock phase (i.e., the first clock phase, $\phi_1$, for circuit 650 shown in FIG. 6) and subtracting the sampled offset and noise from the input signal during the alternate clock phase (i.e., the second clock phase, $\phi_2$, for circuit 650). Because the offset and noise are sampled and canceled on successive phases of the clock signal, low frequency noise and DC offset (which are highly correlated signal components) can be effectively canceled out.

FIG. 6B shows a single-ended design of correlated double-sampling circuit 650. A differential design may be implemented by replicating the same arrangement of switches and capacitor, which are then coupled to the non-inverting input and inverting output of amplifier 670. A capacitor complementary to capacitor 662 is used for the differential signal path. The differential design typically provides improved linearity and noise performance.

Correlated double-sampling circuit 650 is described in further detail by C. C. Enz and G. C. Temes in a paper entitled "Circuit Techniques for Reducing the Effects of Op-Amp Imperfection: Autozeroing, Correlated double-sampling, and Chopper Stabilization," Proceedings of the IEEE, Volume 84, No. 11, November 1996. Example designs for an auto-zeroing circuit and a chopper stabilization circuit are also described in the paper.

Figure 7A:
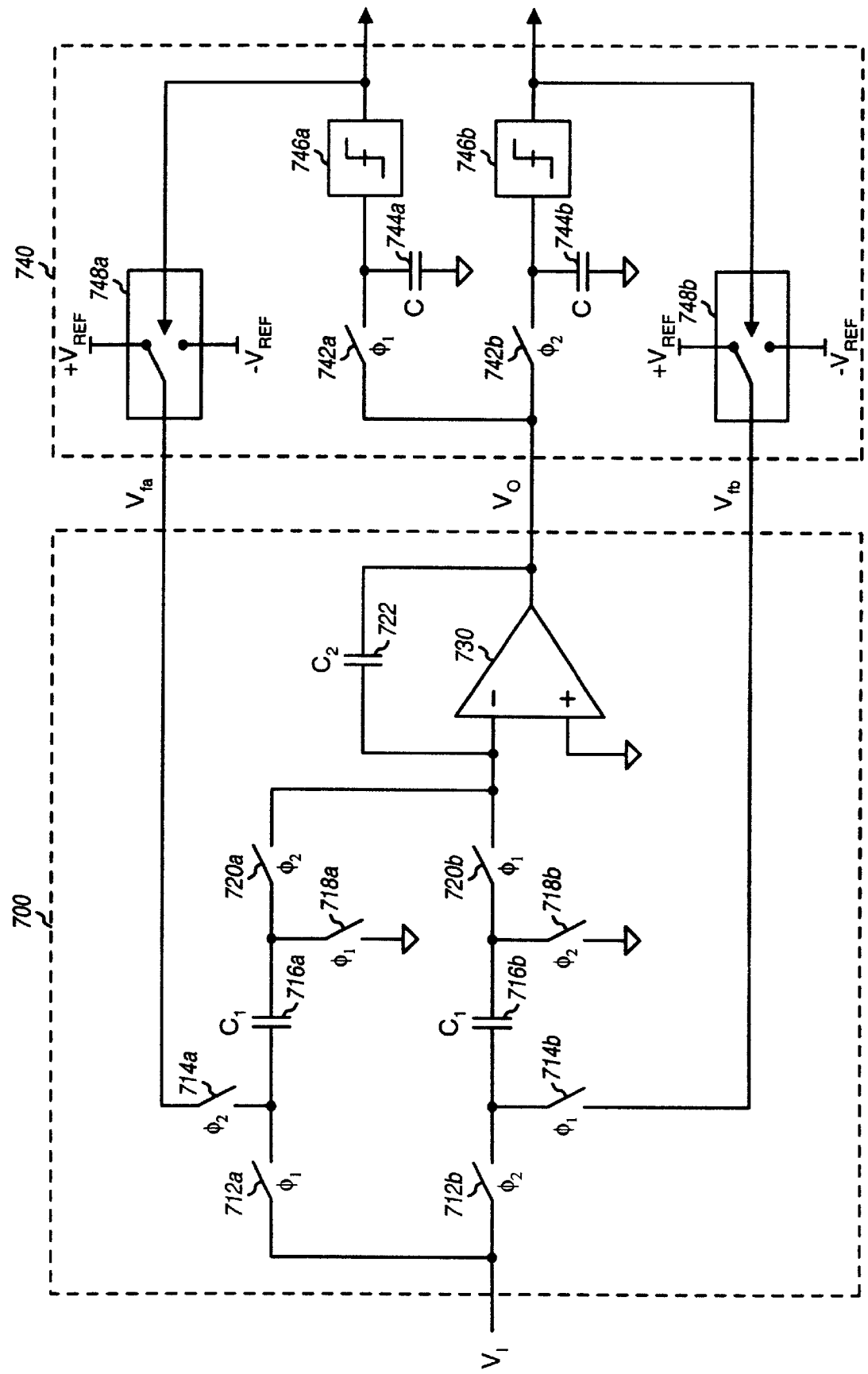
FIG. 7A is a schematic diagram of an integrator implemented with a double-sampling SC circuit.
Figure 7B:
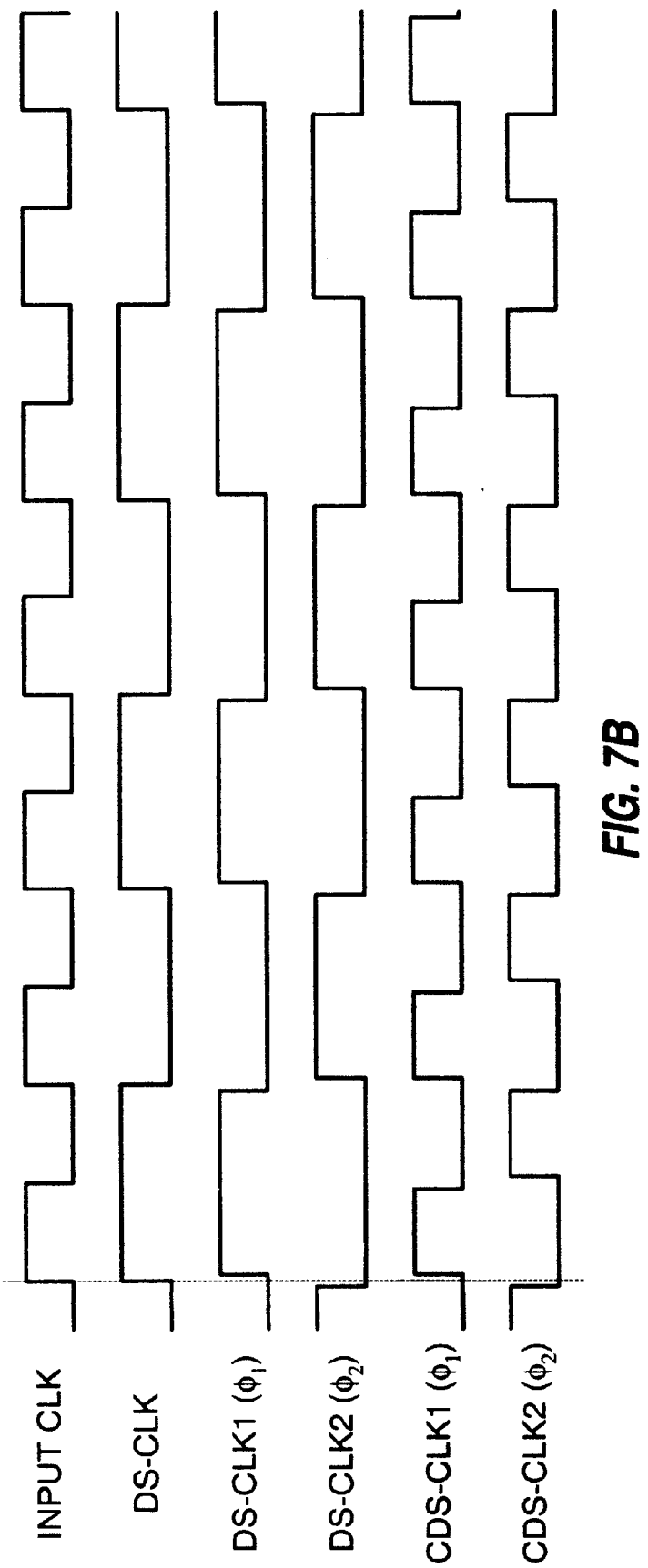
FIG. 7B is a timing diagram of the clock signals used for the double-sampling SC circuits shown in FIGS. 6, 7A, and 8.

FIG. 7A is a schematic diagram of an integrator implemented with a double-sampling switched capacitor (SC) circuit 700. Double-sampling SC circuit 700 may be used for the second and subsequent stages of a multi-stage circuit. For example, double-sampling SC circuit 700 may be used for section 220 of $\Delta\Sigma$ modulator 200b in FIG. 2B, section 320 of biquad lowpass filter 300b in FIG. 3B, section 412b of MASH ADC 400 in FIG. 4A, and sections 512b through 512d of MASH ADC 500 in FIG. 5.

Double-sampling SC circuit 700 includes two signal paths that utilize a common amplifier 730. Each signal path samples the input signal, $V_I$, on a respective phase of the sampling clock signal and provides the sampled signal to the output, $V_O$, on the alternate phase of the clock. Each signal path includes a switch 712 having one end that couples to the input signal, $V_I$. The other end of switch 712 couples to one end of a switch 714 and one end of a capacitor 716. The other end of switch 714 receives a feedback signal, and the other end of capacitor 716 couples to one end of switches 718 and 720. The other end of switch 718 couples to AC ground, and the other end of switch 720 couples to the inverting input of amplifier 730. A feedback capacitor 722 couples across the inverting input and the output of amplifier 730. The non-inverting input of amplifier 730 couples to AC ground. The output of amplifier 730 comprises the output, $V_O$, of double-sampling SC circuit 700.

As shown in FIG. 7, each of the switches is operated (i.e., closed) on either the first phase, $\phi_1$, or second phase, $\phi_2$, of the sampling clock. The first and second phases are 180° out of phase. A timing diagram of the clock signals used for double-sampling SC circuit 700 is shown in FIG. 7B.

Each signal path of double-sampling SC circuit 700 provides a transfer function of $$\frac{K \cdot z^{-1/2}}{1 - z^{-1/2}},$$

where $K = C_1/C_2$.

A summer can be integrated within each signal path by providing the feedback signal to the other end of switch 714, as shown in FIG. 7A. Otherwise, this end of switch 714 is coupled to AC ground. A subtraction function can be obtained by inverting the feedback signal and providing the inverted feedback signal to switch 714.

FIG. 7A shows a single-ended design of double-sampling SC circuit 700. A differential design may be implemented by replicating the two signal paths shown in FIG. 7A, with the new signal paths being coupled to the non-inverting input and inverting output of amplifier 730. As noted above, a differential design typically provides improved linearity and noise performance.

Double-sampling SC circuit 700 operates as follows. During the first phase, $\phi_1$, switches 712a and 718a in the first signal path are closed, and capacitor 716a is charged or discharged by the input signal, $V_I$. During the second phase, $\phi_2$, switches 714a and 720a are closed, and the voltage previously charged on capacitor 716 is provided to the output, $V_O$. The feedback signal is also combined with the previously sampled input signal and provided to the output, $V_O$, during the second phase. The second signal path operates on similar principle as the first signal path, but on the opposite phase. Thus, the second signal path samples the input signal, $V_I$, on the second phase, $\phi_2$, and provides the sampled signal to the output on the first phase, $\phi_1$.

By sampling the input signal, $V_I$, on alternate phases of the sampling clock, the switches can be operated at half the sampling frequency, or $f_S/2$, while still effectively sampling the input signal at the sampling frequency of $f_S$. Since a common amplifier 730 is shared by the two signal paths, the output signal, $V_O$, includes the sampled signals from both clock phases.

FIG. 7A also shows a schematic diagram of a design of a double-sampling quantizer 740, which may be used for a $\Delta\Sigma$ modulator or a MASH ADC. Double-sampling quantizer 740 is typically used in conjunction with a double-sampling circuit (e.g., circuit 700) to provide quantized outputs corresponding to the first and second clock phases, which are then provided as the feedbacks for preceding section(s) of a $\Delta\Sigma$ modulator or a MASH ADC. For example, double-sampling quantizer 740 may be used for the quantizer of $\Delta\Sigma$ modulator 200b in FIG. 2B, quantizer 414b of MASH ADC 400 in FIG. 4A, and each of quantizers 514a and 514b of MASH ADC 500 in FIG. 5.

Double-sampling quantizer 740 includes two signal paths, with each signal path quantizing the quantizer input signal (which is the output signal, $V_O$, from a preceding section) on a respective phase of the sampling clock, which has a frequency of $f_S/2$. In the embodiment shown in FIG. 7A, each signal path includes a switch 742 having one end that couples to the signal, $V_O$. The other end of switch 742 couples to one end of a capacitor 744 and to the input of a quantizer 746. The other end of capacitor 744 couples to AC ground. Quantizer 746 quantizes the signal, $V_O$, and provides the quantized output to a 1-bit digital-to-analog converter (DAC) 748. DAC 748 is implemented with a switch that couples either a positive reference voltage (+V) or a negative reference voltage (−V) to the DAC output. The particular reference voltage to be coupled to the DAC output is dependent on the value of the quantized output. The +V and −V reference voltages define the signal range within which the input signal, $V_I$, should conform to be properly digitized.

Switch 742a and quantizer 746a are operated (i.e., closed and sampled, respectively) on the first phase, $\phi_1$, of the sampling clock, and switch 742b and quantizer 746b are operated on the second phase, $\phi_2$. The quantized outputs from quantizers 746a and 746b may be multiplexed (not shown) to provide a feedback for a single-sampling section (e.g., section 512a in FIG. 5). Alternatively, a third signal path can be formed with a capacitor coupled to the signal, $V_O$, and to a quantizer operated at the sampling frequency of $f_S$ (instead of the sampling frequency of $f_S/2$ for quantizers 464a and 464b) to provide the feedback for the single-sampling section.

FIG. 7B is a timing diagram of the clock signals for correlated double-sampling circuit 650, double-sampling SC circuit 700, and double-sampling quantizer 740. In the timing diagram, the input clock has a frequency of $f_S$ (i.e., the sampling frequency) and is used to generate the clock signals for the double-sampling circuit and double-sampling quantizer. The input clock is divided by two to generate a double-sampling clock, DS-CLK, having half the sampling frequency, or $f_S/2$. The double-sampling clock signals, DS-CLK1 and DS-CLK2, corresponding to the first and second clock phases, $\phi_1$ and $\phi_2$, respectively, can be generated based on the input clock. Each of the clock signals, DS-CLK1 and DS-CLK2, should have a duty cycle that is less than 50 percent, which ensures that a capacitor can be decoupled from one signal source before being coupled to another signal source during switching. The minimum width of these clock signals is determined by the charging time of the capacitors which, in turn, is determined by the size of the capacitor and the ON resistance of the switches. Although not shown in FIG. 7B for simplicity, the clock signals may be generated with timing skews to effectuate the bottom plate sampling described above in FIG. 6A and applicable for all switched capacitor circuits.

For correlated double-sampling circuit 650, two clock signals, CDS-CLK1 and CDS-CLK2, corresponding to the first and second clock phases, $\phi_1$ and $\phi_2$, respectively, are generated at the sampling frequency of $f_S$. These clock signals may be generated based on the input clock or a higher frequency clock signal (not shown). As shown in FIG. 7B, correlated double-sampling circuit 650 is operated at the sampling frequency of $f_S$, and double-sampling SC circuit 700 is operated as half the sampling frequency, or $f_S/2$.

Figure 8:
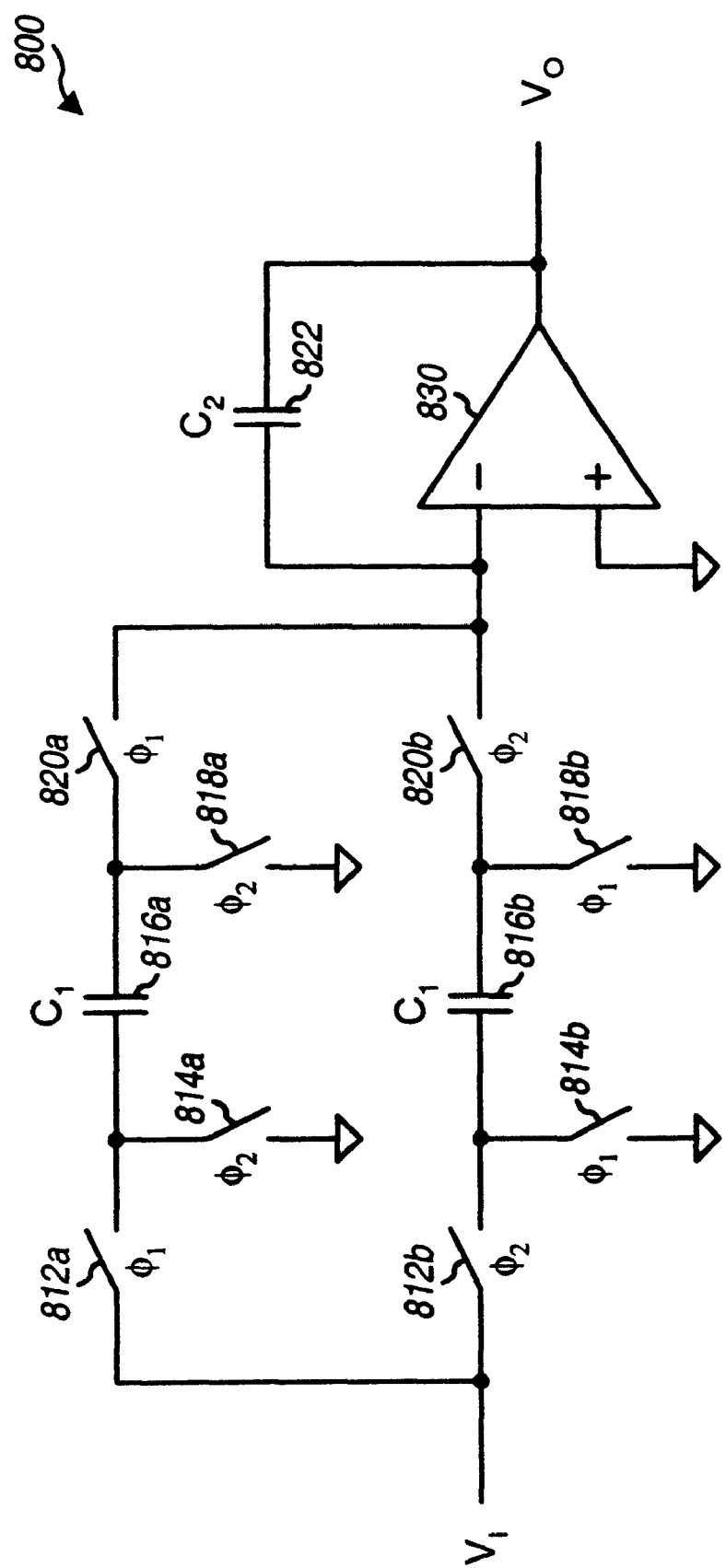
FIG. 8 is a schematic diagram of another integrator implemented with a double-sampling SC circuit.

FIG. 8 is a schematic diagram of another integrator implemented with a double-sampling SC circuit 800, which may also be used for the second and subsequent stages of a multi-stage circuit. Double-sampling SC circuit 800 includes two signal paths utilizing a common amplifier 830. Each signal path samples the input signal, $V_I$, on a respective phase of the sampling clock and provides the sampled signal on the alternate phase.

In the embodiment shown in FIG. 8, each signal path includes switches 812, 814, 818, and 820 and capacitors 816 and 822 coupled in similar manner as switches 712, 714, 718, and 720 and capacitors 716 and 722 in FIG. 7A. However, switches 812a and 820a in the first signal path are operated on the first phase, $\phi_1$, of the sampling clock and switches 814a and 818a are operated on the second phase, $\phi_2$, of the sampling clock. The operation of the switches 814 and 818 thus differs from that of switches 714 and 718 for circuit 700. Each signal path of double-sampling SC circuit 800 provides a transfer function of $$\frac{K}{1-z^{-1/2}},$$

where $K=C_1/C_2$. The transfer function for double-sampling SC circuit 800 does not include a delay of $z^{-1/2}$ (i.e., there is no $z^{-1/2}$ in the numerator of the transfer function) because the input signal, $V_I$, is applied to capacitor 816 and also provided to the output, $V_O$, on the same clock phase. Double-sampling SC circuit 800 may be used for the second section 320 of biquad lowpass filter 300b in FIG. 3B.

FIGS. 7A and 8 show two designs of a double-sampling SC circuit that may be used for the second and subsequent stages of a multi-stage circuit (i.e., all stages except for the first stage). The second and subsequent stages may also be implemented using quadruple-sampling or higher sampling SC circuits.

The stages of the multi-stage circuit may be implemented using numerous analog circuit techniques. For example, the stages (or sections) may be implemented with sampled-data analog circuit techniques such as switched capacitor and switched current. The stages (or sections) may also be implemented with continuous time analog circuit techniques such as active-RC, gm-C, and MOSFET-C. The selection of the particular analog circuit technique to use for the stages of the multi-stage circuit is typically dependent on the requirement of the application in which the multi-stage circuit (e.g., filter, ADC) will be used. SC circuit technique is popular because it can provide a combination of low cost and high performance (i.e., sufficient SNR, accuracy, and speed for many applications).

As noted above, the use of a correlated double-sampling, auto-zeroing, or chopper stabilization circuit for the first stage (or section) of a multi-stage circuit provides numerous benefits. Using any one of these circuits, the multi-stage circuit (which may be a filter or an ADC) may be made less sensitive to deleterious effects due to DC offset, low frequency (1/f) noise, and finite amplifier gain. Without this first stage, the low frequency noise and DC offset in the first stage (e.g., an input integrator) would enter the output signal unfiltered. For a cascaded (e.g., MASH) architecture, the finite gain of the amplifier in the input stage would further allow leakage of a relatively large amount of unfiltered quantization noise onto the output signal. These degradations may be ameliorated by the use of a correlated double-sampling, auto-zeroing, or chopper stabilization circuit for the first stage.

The DC offset, low frequency noise, and finite amplifier gain effects are less severe for the second and subsequent stages. Thus, double-sampling and higher order sampling circuits may be used to reduce power consumption with minimal impact to the overall performance of the multi-stage circuit.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A multi-stage circuit having a stage of a first type and at least two stages of a second type, each stage of the at least two stages receiving an output from at least one of the stage of the first type or a preceding one of the at least two stages, the stage of the first type is configured as a single-sampling circuit operating at a sampling frequency, and the at least two stages of the second type are configured as a multi-sampling circuit operating at a lower frequency, the single-sampling circuit operating to receive an input signal and to generate an output providing at least one of low frequency noise, DC offset, and amplifier gain amelioration and reduced path mismatch; and the multi-sampling circuit operating to receive the output from the single-sampling circuit and to generate a low power output in response thereto.

2. The multi-stage circuit of claim 1, wherein the multi-sampling circuit is a double-sampling circuit.

3. The multi-stage circuit of claim 1, wherein each associated stage of the multi-sampling circuit receives the same lower frequency but a different respective phase.

4. The multi-stage circuit of claim 1, wherein each associated stage of the multi-sampling circuit receives a different lower frequency.

5. The multi-stage circuit of claim 1, wherein the first-sampling circuit is one of a correlated double-sampling (CDS) circuit, an auto-zeroing (AZ) cicruit and a chopper stabilization (CS) circuit.

6. The multi-stage circuit of claim 5, wherein each associated stage of the multi-sampling circuit receives the same lower frequency but a different respective phase.

7. The multi-stage circuit of claim 5, wherein each associated stage of the multi-sampling circuit receives a different lower frequency.

8. The multi-stage circuit of claim 1, wherein the multi-stage circuit is of a CMOS-type process technology.

9. The multi-stage circuit of claim 1, wherein the multi-stage circuit is an analog to digital converter (ADC) and the single-sampling circuit is a lowpass circuit stage of the ADC.

10. The multi-stage circuit of claim 9, wherein each associated stage of the multi-sampling circuit receives the same lower frequency but a different respective phase.

11. The multi-stage circuit of claim 9, wherein each associated stage of the multi-sampling circuit receives a different lower frequency.

12. The multi-stage circuit of claim 1, wherein the multi-stage circuit is a filter and the single-sampling circuit is a lowpass circuit stage of the filter.

13. The multi-stage circuit of claim 1, wherein the multi-stage circuit is a portion of a sigma-delta ADC and the single-sampling circuit and multi-sampling circuit together operably define a sigma-delta modulator of the sigma-delta ADC.

14. The multi-stage circuit of claim 13, wherein each associated stage of the multi-sampling circuit receives the same lower frequency but a different respective phase.

15. The multi-stage circuit of claim 13, wherein each associated stage of the multi-sampling circuit receives a different lower frequency.

16. The multi-stage circuit of claim 13, wherein the multi-stage circuit is of a CMOS-type process technology.

17. The multi-stage circuit of claim 1, wherein the multi-stage circuit is a higher order lowpass filter of cascading multiple biquad lowpass filters, wherein a first biquad lowpass filter in the cascade defines the first-sampling circuit and the remaining biquad lowpass filters define the multi-sampling circuit.

18. The multi-stage circuit of claim 17, wherein each associated stage of the multi-sampling circuit receives the same lower frequency but a different respective phase.

19. The multi-stage circuit of claim 17, wherein each associated stage of the multi-sampling circuit receives a different lower frequency.

20. The multi-stage circuit of claim 1, wherein the single-sampling circuit is a correlated double-sampling switched capacitor circuit and the multi-sampling circuit is comprised of multiple stages of non-correlated double-sampling switched capacitor circuits.

* * * * *